(12) United States Patent
Kwon et al.

(10) Patent No.: US 12,089,432 B2
(45) Date of Patent: Sep. 10, 2024

(54) DISPLAY DEVICE

(71) Applicant: SAMSUNG DISPLAY CO., LTD., Yongin-si (KR)

(72) Inventors: Ohjune Kwon, Hwaseong-si (KR); Woo Yong Sung, Seoul (KR); Jinho Hyun, Gwacheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 405 days.

(21) Appl. No.: 17/698,193

(22) Filed: Mar. 18, 2022

(65) Prior Publication Data

US 2023/0056954 A1    Feb. 23, 2023

(30) Foreign Application Priority Data

Aug. 18, 2021  (KR) .................. 10-2021-0109088

(51) Int. Cl.
*H10K 50/844* (2023.01)
*H10K 59/131* (2023.01)

(52) U.S. Cl.
CPC ........ *H10K 50/844* (2023.02); *H10K 59/131* (2023.02)

(58) Field of Classification Search
None
See application file for complete search history.

(56) References Cited

U.S. PATENT DOCUMENTS

2017/0033312 A1* 2/2017 Kim ................. H10K 50/844
2022/0102689 A1* 3/2022 Jiang ................ H10K 59/124

FOREIGN PATENT DOCUMENTS

| KR | 10-1015851      | 2/2011 |
| KR | 10-2015-0025994 | 3/2015 |
| KR | 10-2018-0011924 | 2/2018 |
| KR | 10-2020-0071194 | 6/2020 |

* cited by examiner

*Primary Examiner* — Cory W Eskridge
(74) *Attorney, Agent, or Firm* — F. CHAU & ASSOCIATES, LLC

(57) ABSTRACT

A display device includes a substrate having a display area and a non-display area surrounding the display area. A drain electrode is disposed in the display area and is positioned adjacent to the non-display area. A light emitting element is disposed in the display area and is connected to the drain electrode. The light emitting element is disposed farther from the non-display area than the drain electrode. A plurality of first dams is disposed in the display area and is positioned between the drain electrode and the light emitting element. Each of the plurality of first dams are spaced apart from each other.

20 Claims, 14 Drawing Sheets

DISPLAY DEVICE

This application claims priority under 35 U.S.C. § 119 to Korean Patent Application No. 10-2021-0109088, filed on Aug. 18, 2021 in the Korean Intellectual Property Office, the disclosure of which is incorporated by reference in its entirety herein.

1. TECHNICAL FIELD

Embodiments of the disclosure relate to a display device. More particularly, embodiments of the disclosure relate to a display device capable of displaying an image.

2. DISCUSSION OF RELATED ART

A display device is manufactured and used in various ways. The display device may display light to provide visual information to the user and may be applied to various different electronic devices. The display device may include a liquid crystal display device that emits light using a liquid crystal layer, an inorganic light emitting display device that emits light using an inorganic light emitting material, or an organic light emitting display device that emits light using an organic light emitting material.

A thin film encapsulation layer may be disposed on the light emitting materials to protect the light emitting materials. The thin film encapsulation layer may have a structure in which inorganic layers and at least one organic layer are alternately stacked. In some embodiments, the organic layer may have a flat top surface and may be disposed to be thicker than the inorganic layer. As a thickness of the organic layer increases, the performance of the display device may increase.

Accordingly, various methods are being developed to thicken the organic layer of the thin film encapsulation layer.

SUMMARY

Embodiments of the present disclosure may provide a display device with increased display performance.

According to an embodiment of the present disclosure, a display device includes a substrate having a display area and a non-display area surrounding the display area. A drain electrode is disposed in the display area and is positioned adjacent to the non-display area. A light emitting element is disposed in the display area and is connected to the drain electrode. The light emitting element is disposed farther from the non-display area than the drain electrode. A plurality of first dams is disposed in the display area and is positioned between the drain electrode and the light emitting element. Each of the plurality of first dams are spaced apart from each other.

In an embodiment, in a plan view, a shape of the plurality of first dams may become narrower in a direction from the display area towards the non-display area.

In an embodiment, in a plan view, the plurality of first dams may be arranged along an imaginary line extending in a first direction.

In an embodiment, in a plan view, the plurality of first dams may be arranged in a zigzag form in relation to an imaginary line extending in a first direction.

In an embodiment, in a cross-sectional view, a sidewall of each of the plurality of first dams that is positioned in a direction towards the display area extends in a vertical direction that is perpendicular to the substrate.

In an embodiment, in a cross-sectional view, a height of each of the plurality of first dams gradually decreases in a direction from the display area towards the non-display area.

In an embodiment, the display device may further include a second dam disposed on the non-display area of the substrate.

In an embodiment, the display device may further include a thin film encapsulation layer disposed on the light emitting element, and the thin film encapsulation layer may include a first inorganic layer disposed on the light emitting element, an organic layer disposed on the first inorganic layer and a second inorganic layer disposed on the organic layer.

In an embodiment, the plurality of first dams may prevent the organic layer from overflowing from the display area to the non-display area, and the organic layer may be also disposed in an area between adjacent first dams of the plurality of first dams.

In an embodiment, a low power voltage may be applied to the drain electrode.

According to an embodiment of the present disclosure, a display device includes a substrate having a display area and a non-display area surrounding the display area. A drain electrode is disposed in the display area and is positioned adjacent to the non-display area. A cathode electrode is disposed in the display area and is connected to the drain electrode. The cathode electrode is disposed farther from the non-display area than the drain electrode. A plurality of first dams is disposed in the display area and is positioned between the drain electrode and the cathode electrode. Each of the plurality of first dams are spaced apart from each other. The cathode electrode is disposed to cover the plurality of first dams.

In an embodiment, the cathode electrode may be also disposed in an area between adjacent first dams of the plurality of first dams.

In an embodiment, in a plan view, a shape of the plurality of first dams may become narrower in a direction from the display area towards the non-display area.

In an embodiment, in a cross-sectional view, a sidewall of each of the plurality of first dams that is positioned in a direction towards the display area extends in a vertical direction that is perpendicular to the substrate.

In an embodiment, the cathode electrode may be disconnected from the sidewall of each of the plurality of first dams that is positioned in the direction towards the display area.

In an embodiment, in a cross-sectional view, a height of each of the plurality of first dams may gradually decrease in a direction from the display area towards the non-display area.

In an embodiment, the display device may further include a second dam disposed on the non-display area of the substrate.

In an embodiment, the second dam includes a plurality of second dams, and each of the plurality of second dams are spaced apart from each other.

In an embodiment, the display device may further include a thin film encapsulation layer disposed on the cathode electrode, and the thin film encapsulation layer may include a first inorganic layer disposed on the cathode electrode, an organic layer disposed on the first inorganic layer and a second inorganic layer disposed on the organic layer.

In an embodiment, the plurality of first dams may prevent the organic layer from overflowing from the display area to the non-display area and the organic layer may be also disposed in an area between adjacent first dams of the plurality of first dams.

The display device according to embodiments of the present disclosure may include a plurality of dams disposed in the display area. As the plurality of dams serve as dams in the display area, a height at which the organic layer is formed may be increased. Accordingly, the display performance of the display device may be increased.

In this case, since the plurality of dams are spaced apart from each other, lines (e.g., cathode electrodes, etc.) may be disposed in a space in which the plurality of dams are spaced apart from each other.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF EMBODIMENTS

Figure 1:
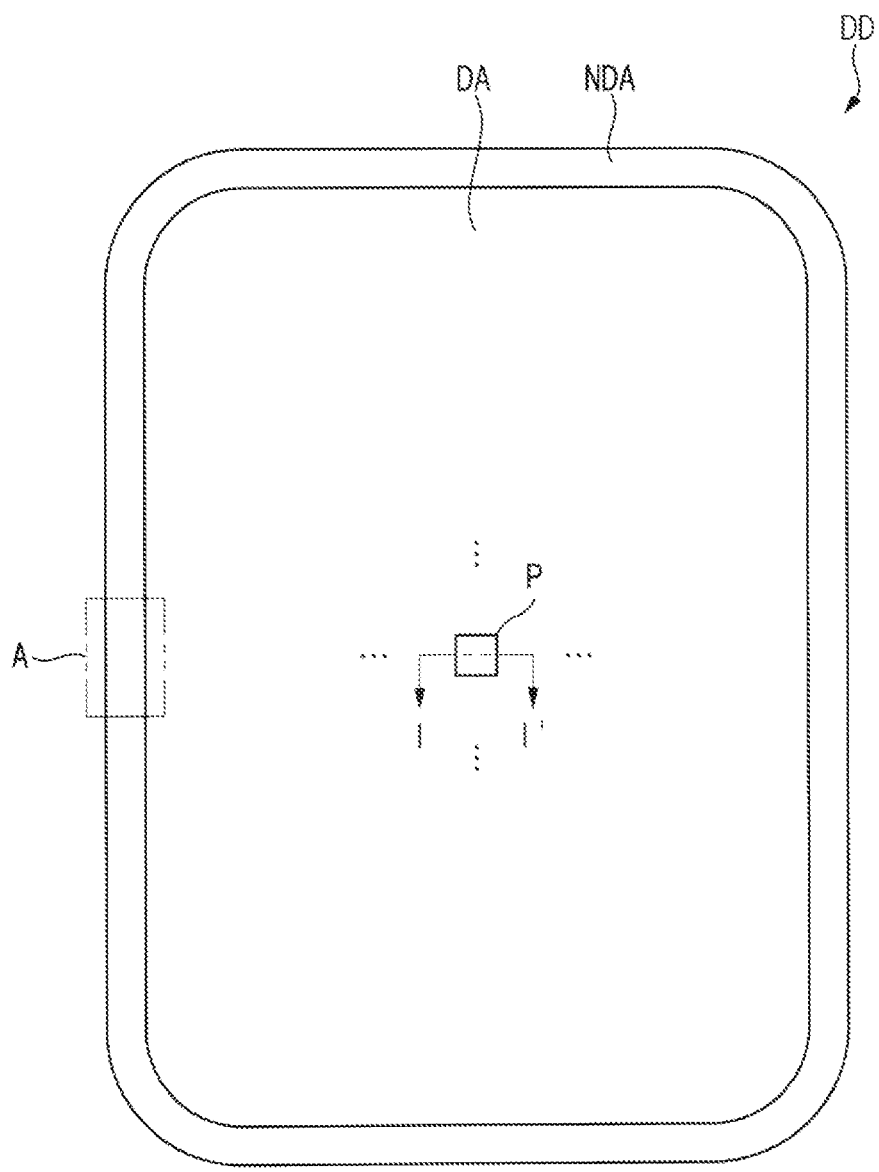
FIG. 1 is a plan view illustrating a display device according to an embodiment of the present disclosure.

Embodiments of the present disclosure now will be described more fully hereinafter with reference to the accompanying drawings. The present disclosure, however, may be embodied in many different forms, and should not be construed as limited to the embodiments set forth herein. Like reference numerals refer to like elements throughout.

FIG. 1 is a plan view illustrating a display device according to an embodiment.

Referring to FIG. 1, a display device DD may include a display area DA and a non-display area NDA. The non-display area NDA may be disposed to surround the display area DA. For example, the non-display area NDA may completely surround the display area DA in a plan view. However, embodiments of the present disclosure are not limited thereto and the non-display area NDA may be disposed on at least one side of the display area DA and may not be disposed on at least one side of the display area DA.

A plurality of pixels P may be disposed in the display area DA. The plurality of pixels P may include a driving element (e.g., a transistor, etc.) and a light emitting element (e.g., an organic light emitting diode, etc.) connected to the driving element. The light emitting element may emit light based on a signal(s) received from the driving element. As such, the display device DD may display an image by emitting light from the plurality of pixels P. The plurality of pixels P may be generally disposed in the display area DA. For example, in an embodiment, the plurality of pixels P may be arranged in a matrix form in the display area DA. However, embodiments of the present disclosure are not limited thereto.

A driver for driving the plurality of pixels P may be disposed in the non-display area NDA. In an embodiment, the driver may include a data driver, a gate driver, a light emitting driver, a power voltage generator, a timing controller and the like. The plurality of pixels P may emit light based on signals received from the drivers.

FIGS. 2, 3, 4 and 5 are views showing enlarged embodiments of area A of FIG. 1. FIGS. 2, 3, 4 and 5 are schematic views to illustrate various embodiments of first dams DAM1.

Figure 2:
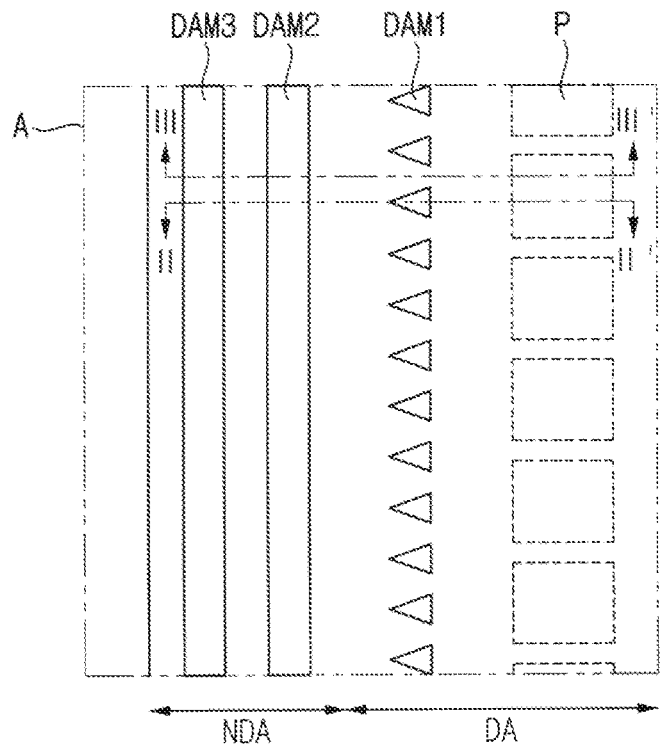
FIGS. 2, 3, 4 and 5 are plan views showing enlarged embodiments of area A of FIG. 1 according to embodiments of the present disclosure.

Referring to FIGS. 1 and 2, the display device DD may include a plurality of pixels P, a plurality of first dams DAM1, a second dam DAM2, and a third dam DAM3. In an embodiment, the plurality of pixels P and the plurality of first dams DAM1 may be disposed in the display area DA. The second dam DAM2 and the third dam DAM3 may be disposed in the non-display area NDA.

The first to third dams DAM1, DAM2, DAM3 may prevent the organic layer from overflowing beyond the non-display area NDA of the display device DD when the organic layer constituting the thin film encapsulation layer is formed on the display device DD. The plurality of first dams DAM1 may serve as dams in the display area DA, and the second and third dams DAM2, DAM3 may serve as dams in the non-display area NDA.

Figure 3:
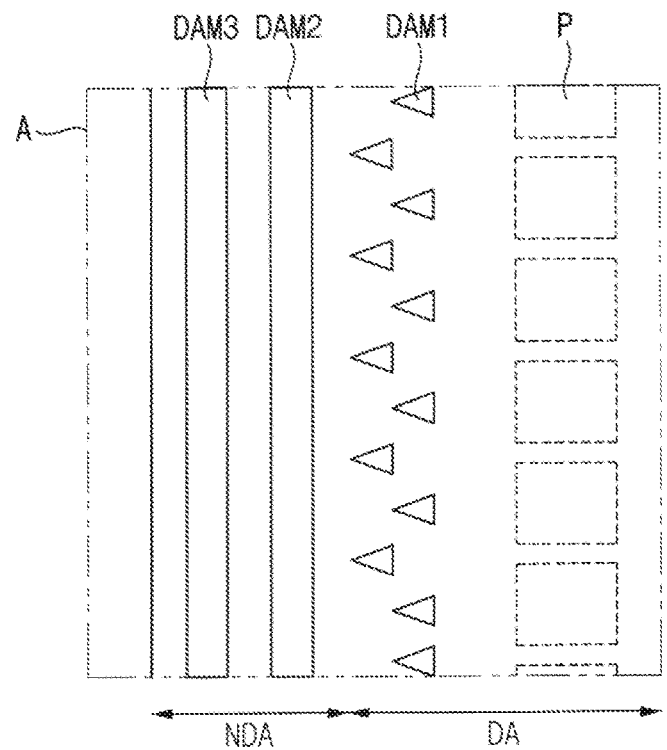

The plurality of first dams DAM1 may be disposed adjacent to each other in one direction. For example, the plurality of first dams DAM1 may be arranged to be adjacent to each other along an imaginary line extending in one direction (e.g., a first direction). Alternatively, as shown in FIG. 3, the plurality of first dams DAM1 may be arranged in a zigzag shape in relation to an imaginary line extending in one direction (e.g., a first direction) in which first dams are alternately offset in a direction perpendicular to the imaginary line extending in one direction. Even in this embodiment, since the plurality of first dams DAM1 are spaced apart from each other, lines (e.g., signal lines, electrodes, etc.) may be disposed in a space between adjacent first dams DAM1 of the plurality of first dams DAM1 that are spaced apart from each other.

In an embodiment, a shape of each of the plurality of first dams DAM1 may become narrower in a plan view in a direction from the display area DA towards the non-display area NDA. Although shapes of the plurality of first dams DAM1 are illustrated in a triangular shape in FIGS. 2 and 3, the shapes of the plurality of first dams DAM1 in a plan view are not limited thereto. For example, in an embodiment, the shapes of the plurality of first dams DAM1 may be semicircular in a plan view.

The plurality of first dams DAM1 may be disposed to be spaced apart from each other. Accordingly, a line disposed outside of the display area DA may be connected to the pixels P through a space in which adjacent first dams of the plurality of first dams DAM1 are spaced apart from each other. For example, in an embodiment, a low power voltage line that transmits a low power voltage may be disposed between adjacent first dams of the plurality of first dams DAM1 and the non-display area NDA. The low power voltage line may be connected to the pixels P. The cathode electrode disposed in the display area DA may extend to the low power voltage line. In this case, the cathode electrode may be disconnected by the plurality of first dams DAM1. However, in an embodiment of the present disclosure, the cathode electrode may be disposed without being disconnected through the space in which adjacent first dams of the plurality of first dams DAM1 are spaced apart. Accordingly, the low power voltage provided through the low power voltage line may be transmitted to the pixels P.

Figure 4:
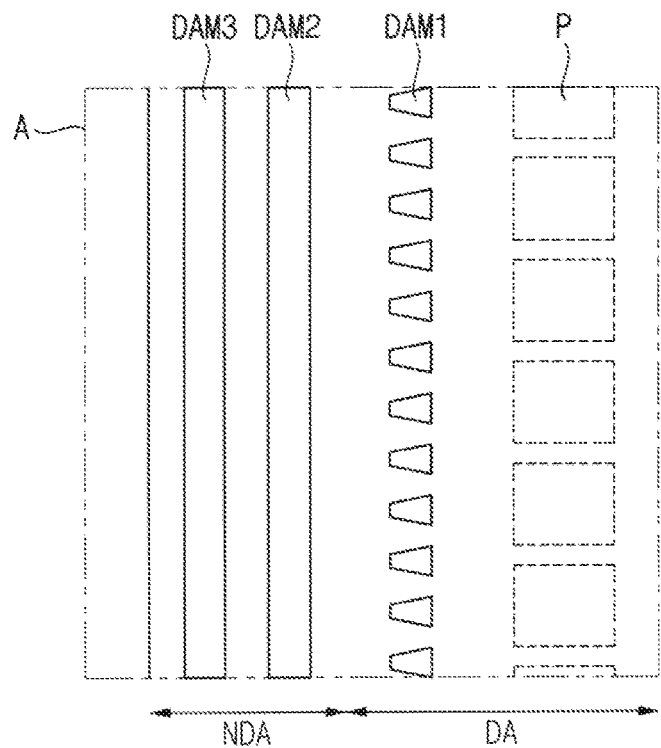

FIG. 4 may be substantially the same as FIG. 2 except for the shapes of the plurality of first dams DAM1. Accordingly, a description of the overlapping configuration will be omitted.

Figure 5:
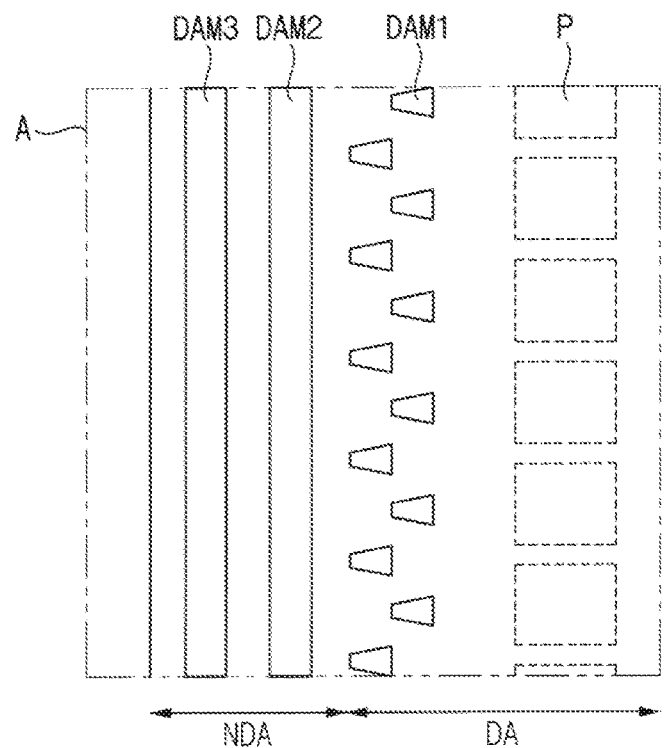

Referring to FIG. 4, the shapes of the plurality of first dams DAM1 may be a trapezoidal shape in a plan view. The plurality of first dams DAM1 may be disposed to be spaced apart from each other. The plurality of first dams DAM1 may be arranged along an imaginary line extending in one direction (e.g., a first direction). Alternatively, the plurality of first dams DAM1 may be arranged in a zigzag shape as illustrated in FIG. 5. Widths of the plurality of first dams DAM1 may become narrower in a direction from the display area DA towards the non-display area NDA in a plan view. In some embodiments, the shapes of the plurality of first dams DAM1 in a plan view may differ from each other.

Figure 6:
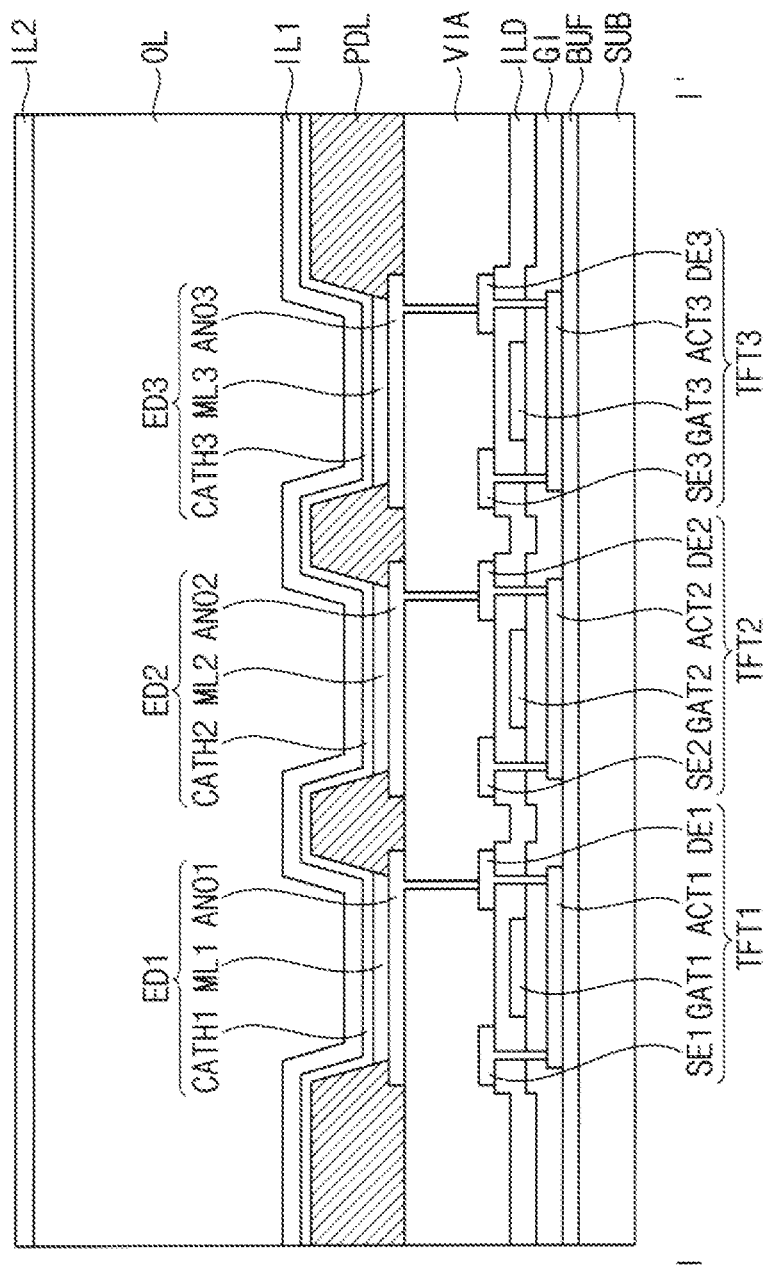
FIG. 6 is a cross-sectional view of a display device taken along line I-I' of FIG. 1 according to embodiments of the present disclosure.

FIG. 6 is a cross-sectional view illustrating a display device taken along line I-I' of FIG. 1.

Referring to FIGS. 1 and 6, the display device DD may include a substrate SUB, a buffer layer BUF, a first transistor TFT1, a second transistor TFT2, a third transistor TFT3, a gate insulating layer GI, an interlayer insulating layer ILD, a via insulating layer VIA, a first light emitting element ED1, a second light emitting element ED2, a third light emitting element ED3, a pixel defining layer PDL, and a thin film encapsulation layer.

In an embodiment, the first transistor TFT1 may include a first active layer ACT1, a first gate electrode GAT1, a first source electrode SE1, and a first drain electrode DE1. The second transistor TFT2 may include a second active layer ACT2, a second gate electrode GAT2, a second source electrode SE2, and a second drain electrode DE2. The third transistor TFT3 may include a third active layer ACT3, a third gate electrode GAT3, a third source electrode SE3, and a third drain electrode DE3.

In an embodiment, the first light emitting element ED1 may include a first anode electrode ANO1, a first intermediate layer ML1 and a first cathode electrode CATH1. The second light emitting element ED2 may include a second anode electrode ANO2, a second intermediate layer ML2 and a second cathode electrode CATH2. The third light emitting element ED3 may include a third anode electrode ANO3, a third intermediate layer ML3 and a third cathode electrode CATH3. In an embodiment, the first to third cathode electrodes CATH3 may be integrally formed and may extend on pixel defining layers PDL from the first light element ED1 to the third light element ED3.

In an embodiment, the thin film encapsulation layer may include a first inorganic layer IL1, an organic layer OL, and a second inorganic layer IL2. Although the thin film encapsulation layer is illustrated as being composed of three layers, the thin film encapsulation layer may further include at least one additional inorganic layer and at least one additional organic layer.

The substrate SUB may include a flexible material or a rigid material. For example, the substrate SUB may include a polymer material such as polyimide, and in this embodiment, the substrate SUB may have flexible properties. Alternatively, for example, the substrate SUB may include a material such as glass, and in this embodiment, the substrate SUB may have a rigid characteristic.

The buffer layer BUF may be disposed on the substrate SUB (e.g., directly thereon in a thickness direction of the substrate SUB). In an embodiment, the buffer layer BUF may include an inorganic insulating material. Examples of the material that the buffer layer BUF may be composed of include silicon oxide ("SiOx"), silicon nitride ("SiNx"), silicon oxynitride ("SiON") and the like. These may be used alone or in combination with each other. However, embodiments of the present disclosure are not limited thereto. The buffer layer BUF may prevent metal atoms or impurities from diffusing into the first to third active layers ACT1, ACT2, ACT3. In addition, the buffer layer BUF may control the speed of heat provided to the first to third active layers ACT1, ACT2, ACT3 during the crystallization process for forming the first to third active layers ACT1, ACT2, ACT3.

The first to third active layers ACT1, ACT2, ACT3 may be disposed on the buffer layer BUF (e.g., directly thereon in a thickness direction of the substrate SUB). In an embodiment, the first to third active layers ACT1, ACT2, ACT3 may include a silicon semiconductor. Examples of materials that the first to third active layers ACT1, ACT2, ACT3 may be composed of include amorphous silicon and polycrystalline silicon. Alternatively, in some embodiments, the first to third active layers ACT1, ACT2, ACT3 may include an oxide semiconductor. Examples of materials that the first to third active layers ACT1, ACT2, ACT3 may be composed of include indium-gallium-zinc oxide (IGZO), indium-gallium oxide (IGO), indium-zinc oxide (IZO), and the like. However, embodiments of the present disclosure are not limited thereto.

The gate insulating layer GI may be disposed on the buffer layer BUF (e.g., directly thereon in a thickness direction of the substrate SUB). The gate insulating layer GI may be disposed to cover the first to third active layers ACT1, ACT2, ACT3. The gate insulating layer GI may include an insulating material. Examples of the material that the gate insulating layer GI may be composed of include silicon oxide ("SiOx"), silicon nitride ("SiNx"), silicon oxynitride ("SiON"), and the like. These may be used alone or in combination with each other.

The first to third gate electrodes GAT1, GAT2, GAT3 may be disposed on the gate insulating layer GI (e.g., directly thereon in a thickness direction of the substrate SUB). The first to third gate electrodes GAT1, GAT2, GAT3 may at least partially overlap the first to third active layers ACT1, ACT2, ACT3 (e.g., in a thickness direction of the substrate SUB). In response to a gate signal provided to the first to third gate electrodes GAT1, GAT2, GAT3, a signal and/or a voltage may flow through the first to third active layers ACT1, ACT2, ACT3. In an embodiment, the first to third gate electrodes GAT1, GAT2, GAT3 may include a metal, an alloy, a metal oxide, a transparent conductive material, or the like. Examples of materials the first to third gate electrodes GAT), GAT2, GAT3 may be composed of include silver ("Ag"), an alloy containing silver, molybdenum ("Mo"), an alloy containing molybdenum, Aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), and the like. These may be used alone or in combination with each other. However, embodiments of the present disclosure are not limited thereto.

The interlayer insulating layer ILD may be disposed on the gate insulating layer GI (e.g., directly thereon in a thickness direction of the substrate SUB). The interlayer insulating layer ILD may be disposed to cover the first to third gate electrodes GAT1, GAT2, GAT3. In an embodiment, the interlayer insulating layer ILD may include an insulating material. Examples of the material that the interlayer insulating layer ILD may be composed of include silicon oxide ("SiOx"), silicon nitride ("SiNx"), silicon oxynitride ("SiON") and the like. These may be used alone or in combination with each other. However, embodiments of the present disclosure are not limited thereto.

The first to third source electrodes SE1, SE2, SE3 and the first to third drain electrodes DE1, DE2, DE3 may be disposed on the interlayer insulating layer ILD (e.g., directly thereon in a thickness direction of the substrate SUB). The first source electrode SE1 and the first drain electrode DE1 may directly contact the first active layer ACT1 through respective contact holes formed to extend through the interlayer insulating layer ILD and the gate insulating layer GI. The second source electrode SE2 and the second drain electrode DE2 may contact the second active layer ACT2 through respective contact holes formed to extend through the interlayer insulating layer ILD and the gate insulating layer GI. The third source electrode SE3 and the third drain electrode DE3 may contact the third active layer ACT3 through respective contact holes formed to extend through the interlayer insulating layer ILD and the gate insulating layer GI. In an embodiment, the first to third source electrodes SE1, SE2, SE3 and the first to third drain electrodes DE1, DE2, DE3 may include a metal, an alloy, a metal oxide, a transparent conductive material, or the like. Examples of materials that the first to third source electrodes SE1, SE2, SE3 and the first to third drain electrodes DE1, DE2, DE3 may be composed of include silver ("Ag"), an alloy containing silver, molybdenum ("Mo"), an alloy containing molybdenum, Aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), and the like. These may be used alone or in combination with each other. However, embodiments of the present disclosure are not limited thereto.

The via insulating layer VIA may be disposed on the interlayer insulating layer ILD (e.g., directly thereon in a thickness direction of the substrate SUB). The via insulating layer VIA may be disposed to cover the first to third source electrodes SE1, SE2, SE3 and the first to third drain electrodes DE1, DE2, DE3. The via insulating layer VIA may have a substantially flat top surface. In an embodiment, the via insulating layer VIA may include an organic insulating material. Examples of the material that the via insulating layer VIA may be composed of include a photoresist, a polyacrylic resin, a polyimide resin, an acrylic resin, and the like. These may be used alone or in combination with each other. However, embodiments of the present disclosure are not limited thereto.

The first to third anode electrodes ANO1, ANO2, ANO3 may be disposed on the via insulating layer VIA (e.g., directly thereon in a thickness direction of the substrate SUB). The first to third anode electrodes ANO1, ANO2, ANO3 may directly contact the first to third drain electrodes DEL, DE2, DE3, respectively through a contact hole that extends through the via insulating layer VIA. In an embodiment, the first to third anode electrodes ANO1, ANO2, ANO3 may include a metal, an alloy, a metal oxide, a transparent conductive material, or the like. Examples of materials that the first to third anode electrodes ANO1, ANO2, ANO3 may be composed of include silver ("Ag"), an alloy containing silver, molybdenum ("Mo"), an alloy containing molybdenum, Aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), and the like. These may be used alone or in combination with each other. However, embodiments of the present disclosure are not limited thereto.

The pixel defining layer PDL may be disposed on the via insulating layer VIA and portions of the first to third anode electrodes ANO1, ANO2, ANO3 (e.g., directly thereon in a thickness direction of the substrate SUB). An opening exposing the first to third anode electrodes ANO1, ANO2, ANO3 may be formed in the pixel defining layer PDL. For example, in an embodiment, the pixel defining layer PDL may be disposed directly on lateral edges of the first to third anode electrodes ANO1, ANO2, ANO3 and the opening may be formed overlapping central portions of the first to third anode electrodes ANO1, ANO2, ANO3. In an embodiment, the pixel defining layer PDL may include an organic material. Examples of the material that the pixel defining layer PDL may be composed of include a photoresist, a polyacrylic resin, a polyimide-based resin, an acrylic resin, and the like. However, embodiments of the present disclosure are not limited thereto.

In an embodiment, the first to third intermediate layers ML1, ML2, ML3 may be disposed on the first to third anode electrodes ANO1, ANO2, ANO3, respectively. The first to third intermediate layers ML1, ML2, ML3 may include an organic material emitting light of a predetermined color. In an embodiment, the first to third intermediate layers ML1, ML2, ML3 may emit light based on the potential difference between the first to third anode electrodes ANO1, ANO2, ANO3 and the first to third cathode electrodes CATH1, CATH2, CATH3. In an embodiment, the first to third intermediate layers ML1, ML2, ML3 may each include an electron injection layer, an electron transport layer, a light emitting layer, a hole transport layer, and a hole injection layer.

In an embodiment, the first to third light emitting elements ED1, ED2, ED3 may emit light having the same color as each other. For example, all of the first to third light emitting elements ED1, ED2, ED3 may emit blue light. Alternatively, the first to third light emitting elements ED1, ED2, ED3 may emit light of different colors. For example, the first to third light emitting elements ED1, ED2, ED3 may respectively emit red light, green light, and blue light. However, embodiments of the present disclosure are not limited thereto and the colors of the first to third light emitting elements ED1, ED2, ED3 may vary.

The first to third cathode electrodes CATH1, CATH2, CATH3 may be disposed on the first to third light emitting elements ED1, ED2, ED3. In an embodiment, the first to third cathode electrodes CATH1, CATH2, CATH3 may include a metal, an alloy, a metal oxide, a transparent conductive material, or the like. Examples of materials that the first to third cathode electrodes CATH1, CATH2, CATH3 may be composed of include silver ("Ag"), an alloy containing silver, molybdenum ("Mo"), an alloy containing molybdenum, Aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), and the like. For convenience of description, the cathode electrode has been described as being divided into discrete electrodes comprising the first to third cathode electrodes CATH1, CATH2, CATH3. However, embodiments of the present disclosure are not limited thereto and the first to third cathode electrodes CATH1, CATH2, CATH3 may be integrally formed.

The thin film encapsulation layer may be disposed on the first to third cathode electrodes CATH1, CATH2, CATH3. The thin film encapsulation layer may protect the first to third light emitting elements ED1, ED2, ED3 from external moisture, heat, impact, and the like. In an embodiment, the thin film encapsulation layer may have a structure in which a first inorganic layer IL1, an organic layer OL, and a second inorganic layer IL2 are stacked (e.g., in a thickness direction of the substrate SUB). In this embodiment, the organic layer OL may have a relatively larger thickness than the first and second inorganic layers IL1, IL2. When the thickness of the organic layer OL is increased, the display performance of the display device DD may increase. To increase the thickness of the organic layer OL, dam structures that are conventionally disposed only in the non-display area NDA may be disposed close to or in the display area DA.

FIGS. 7, 8, 9, 10, 11 and 12 are cross-sectional views illustrating a display device taken along line II-II' of FIG. 2. FIGS. 7, 8, 9, 10, 11 and 12 are cross-sectional views of a portion of the display device that includes the first dam DAM1.

Figure 7:
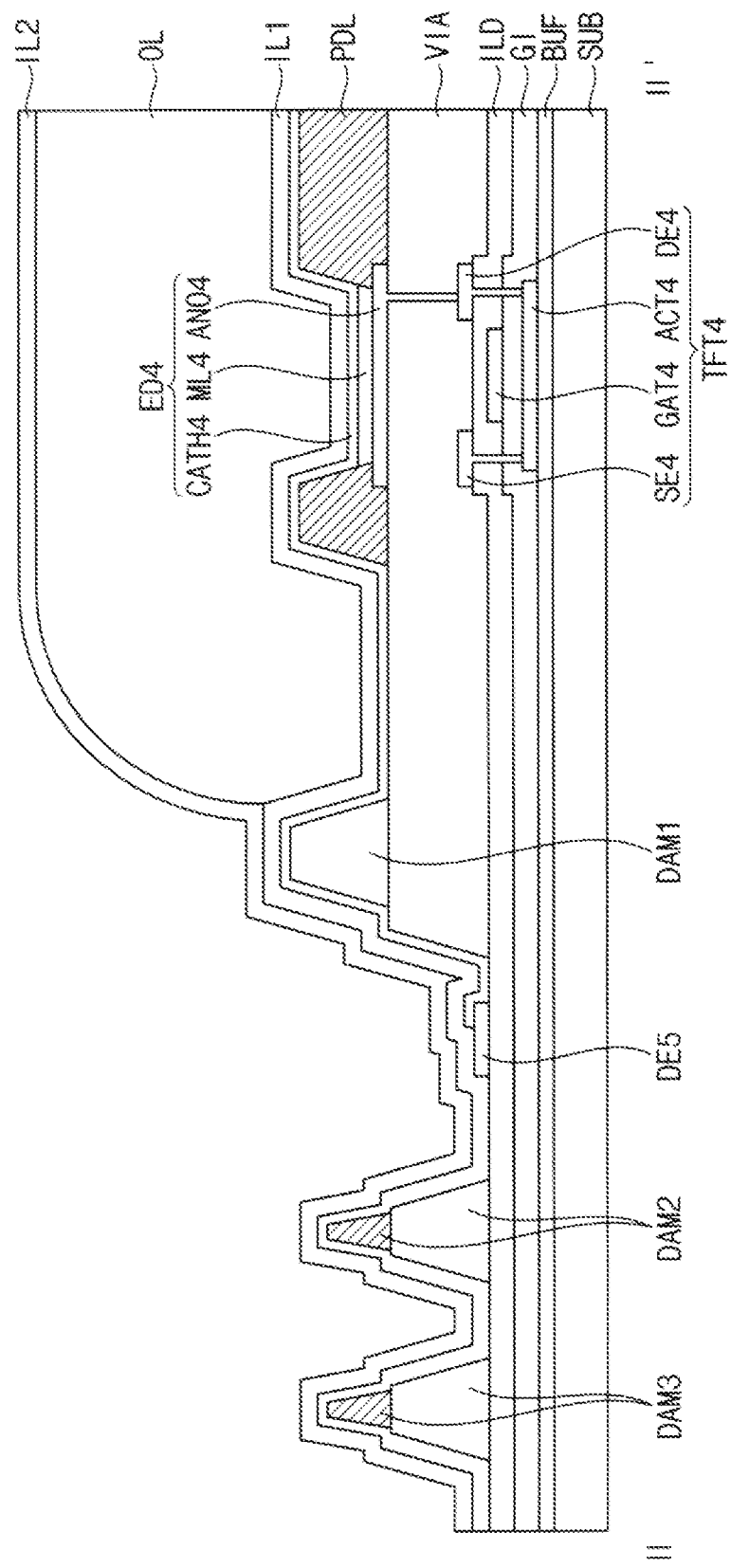
FIGS. 7, 8, 9, 10, 11 and 12 are cross-sectional views of a display device taken along line II-II' of FIG. 2 according to embodiments of the present disclosure.

Referring to FIGS. 1, 2 and 7, the display device DD may include a substrate SUB, a buffer layer BUF, a fourth transistor TFT4, a gate insulating layer GI, an interlayer insulating layer ILD, a via insulating layer VIA, a fourth light emitting element ED4, a pixel defining layer PDL, a thin film encapsulation layer, a fifth drain electrode DE5, a first dam DAM1, a second dam DAM2, and a third dam DAM3.

In an embodiment, the fourth transistor TFT4 may include a fourth active layer ACT4, a fourth gate electrode GAT4, a fourth source electrode SE4, and a fourth drain electrode DE4. The fourth transistor TFT4 may have substantially the same structure as the aforementioned first to third transistors TFT1, TFT2 and TFT3, and may include substantially the same material as the aforementioned first to third transistors TFT1, TFT2 and TFT3. Therefore, a repeated description of identical or similar elements will be omitted for convenience of explanation.

The fourth light emitting element ED4 may include a fourth anode electrode ANO4, a fourth intermediate layer ML4, and a fourth cathode electrode CATH4. The fourth light emitting element ED4 may have substantially the same structure as the above-described first to third light emitting elements ED1, ED2 and ED3, and may include substantially the same material as the above-described first to third light emitting elements ED1, ED2 and ED3. Therefore, a repeated description of identical or similar elements will be omitted for convenience of explanation.

The fifth drain electrode DE5 may be disposed on the interlayer insulating layer ILD (e.g., directly thereon in a thickness direction of the substrate SUB). In an embodiment, the fifth drain electrode DE5 may be disposed in the display area DA and may be positioned between the first dam DAM) and the non-display area NDA. The fourth light emitting element ED4 may be disposed farther from the non-display area NDA than the fifth drain electrode DE5. In an embodiment, the fifth drain electrode DE5 may include substantially the same material as the first to third drain electrodes DE1, DE2 and DE3. A signal and/or a voltage may be applied to the fifth drain electrode DE5. For example, a low power voltage may be applied to the fifth drain electrode DE5. The low power voltage may be provided to the fourth cathode electrode CATH4. The fourth cathode electrode CATH4 may be electrically connected to the fifth drain electrode DE5. The fourth cathode electrode CATH4 is disposed farther from the non-display area NDA than the fifth drain electrode DE5. Although it is illustrated in FIG. 7 that the fourth cathode electrode CATH4 directly contacts the upper surface of the fifth drain electrode DE5, embodiments of the present disclosure are not limited thereto. For example, in an embodiment, the via insulating layer VIA may be disposed to cover the fifth drain electrode DFS, and the fourth cathode electrode CATH4 may be connected to the fifth drain electrode DE5 through a contact hole passing through the via insulating layer VIA.

In an embodiment, the fourth cathode electrode CATH4 may be integrally formed with the first to third cathode electrodes CATH1, CATH2 and CATH3 illustrated in FIG. 6. The fourth cathode electrode CATH4 may be disposed to cover the first dam DAM1. Accordingly, the signal transmitted from the fifth drain electrode DE5 may be transmitted to the first to third cathode electrodes CATH1, CATH2 and CATH3.

In an embodiment, the thin film encapsulation layer may include a first inorganic layer IL1, an organic layer OL, and a second inorganic layer IL2. In an embodiment, the first inorganic layer IL1 and the second inorganic layer IL2 may be formed by chemical vapor deposition. In an embodiment, the organic layer OL may be formed by an inkjet process. First to third dams DAM1, DAM2 and DAM3 may be disposed to prevent the organic layer OL from overflowing beyond the non-display area NDA while the organic layer OL is formed, such as by an inkjet process. The first dam DAM1 may be disposed in the display area DA, and the second and third dams DAM2, DAM3 may be disposed in the non-display area NDA.

The first dam DAM1 may prevent the organic layer OL from overflowing from the display area DA to the non-display area NDA. In an embodiment, the first dam DAM1 may include substantially the same material as the via insulating layer VIA. In comparative embodiments, the dam structure is formed only in the non-display area NDA. Accordingly, as the organic layer OL overflows to the non-display area NDA, the organic layer OL is disposed on a relatively large area, so that the organic layer OL has a low height. However, since the first dam DAM1 according to an embodiment of the present disclosure is formed in the display area DA, the organic layer OL may not overflow to the non-display area NDA. Therefore, the organic layer OL may be disposed to have a relatively large thickness.

The second and third dams DAM2, DAM3 may prevent the organic layer OL from overflowing in the non-display area NDA. The second and third dams DAM2, DAM3 may be formed to prevent the organic layer OL from overflowing in the non-display area NDA in instances in which the organic layer OL overflows beyond the first dam DAM1. In an embodiment, the second and third dams DAM2, DAM3 may have two layers to prevent overflow of the organic layer OL. For example, the second and third dams DAM2, DAM3 may include a lower layer and an upper layer. In an embodiment, the lower layer may include substantially the same material as the via insulating layer VIA. The upper layer may include substantially the same material as the pixel defining layer PDL. However, embodiments of the present disclosure are not limited thereto and each of the second and third dams DAM2, DAM3 may be formed of a single layer, or one of the second and third dams DAM2, DAM3 may be formed of a single layer and the other may be formed of two or more layers.

However, in some embodiments, the second dam and the third dams DAM2, DAM3 may also be formed in plurality in the same manner as the first dam DAM1. For example, at least one of the second dam and the third dams DAM2, DAM3 may have substantially the same structure as the first dam DAM1.

Figure 8:
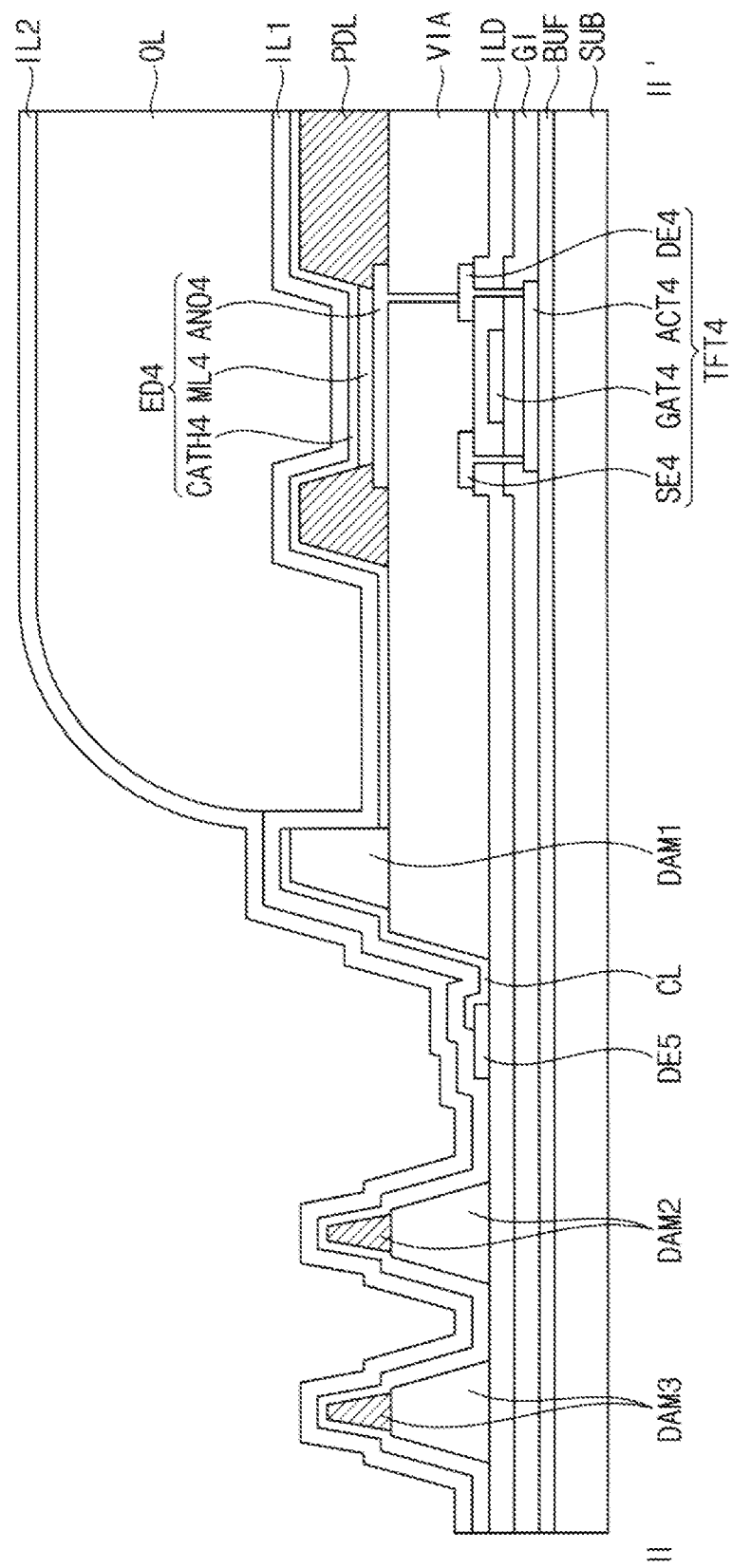
Figure 9:
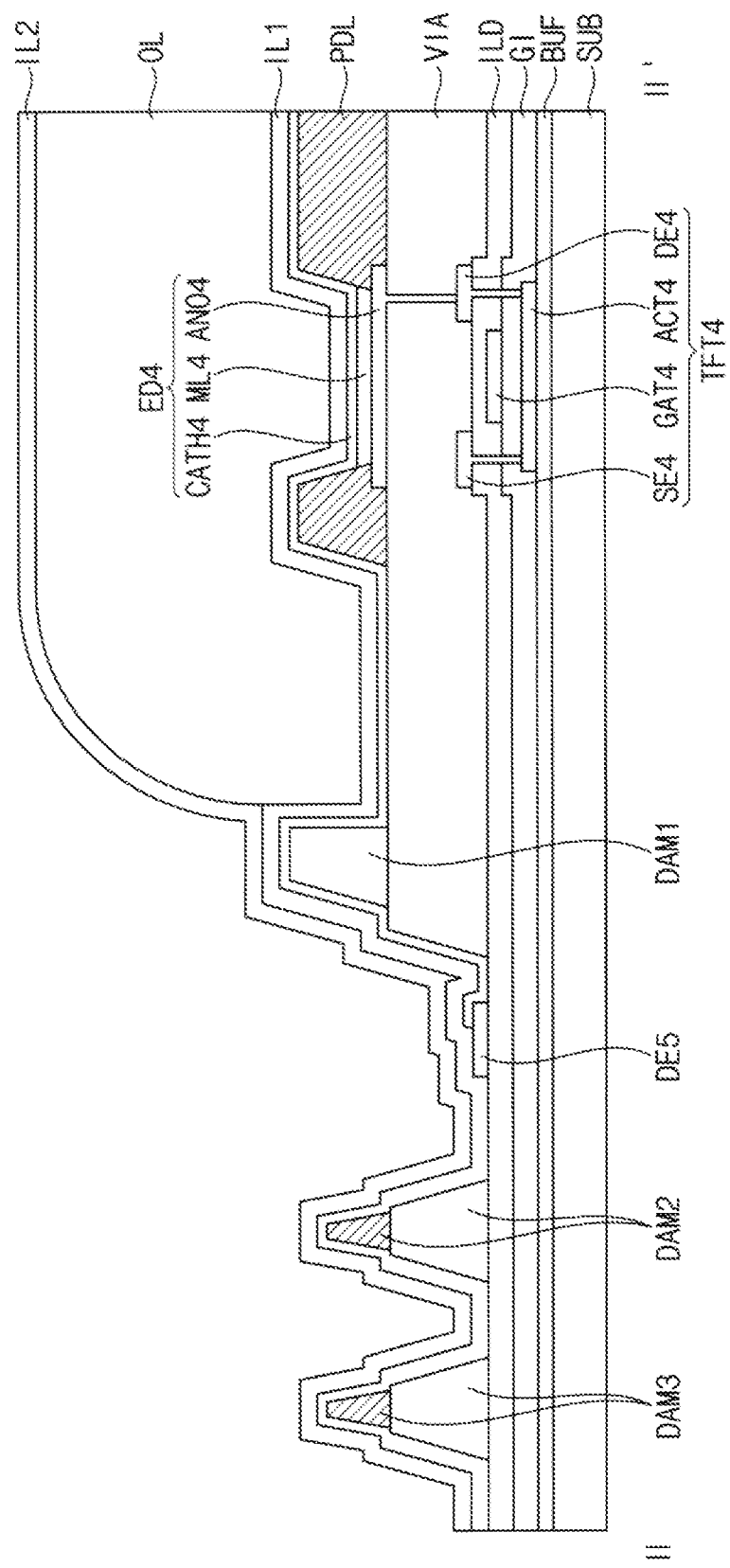

As illustrated in FIG. 8, the sidewall of the first dam DAM1 in the direction towards the display area DA may extend substantially perpendicular to an upper surface of the via insulating layer VIA. For example, the sidewall of the first dam DAM1 in the direction towards the display area DA may extend in a vertical direction that is parallel to a thickness direction of the substrate SUB. Accordingly, the first dam DAM1 may block the overflow of the organic layer OL. In this embodiment, the fourth cathode electrode CATH4 may be disconnected by the vertically-disposed sidewall of the first dam DAM1. For example, as shown in FIG. 8, in an embodiment, the end of the fourth cathode electrode CXTH4 may become a dummy line CL by the first dam DAM1. However, as illustrated in FIG. 9, in an embodiment, the end of the fourth cathode electrode CATH4 may not be disconnected by the first dam DAM1. Alternatively, in an embodiment, the first dam DAM1 may be formed in a reverse tapered shape. In an embodiment, a height of the first dam DAM1 may gradually decrease in a direction from the display area DA towards the non-display area NDA.

Figure 10:
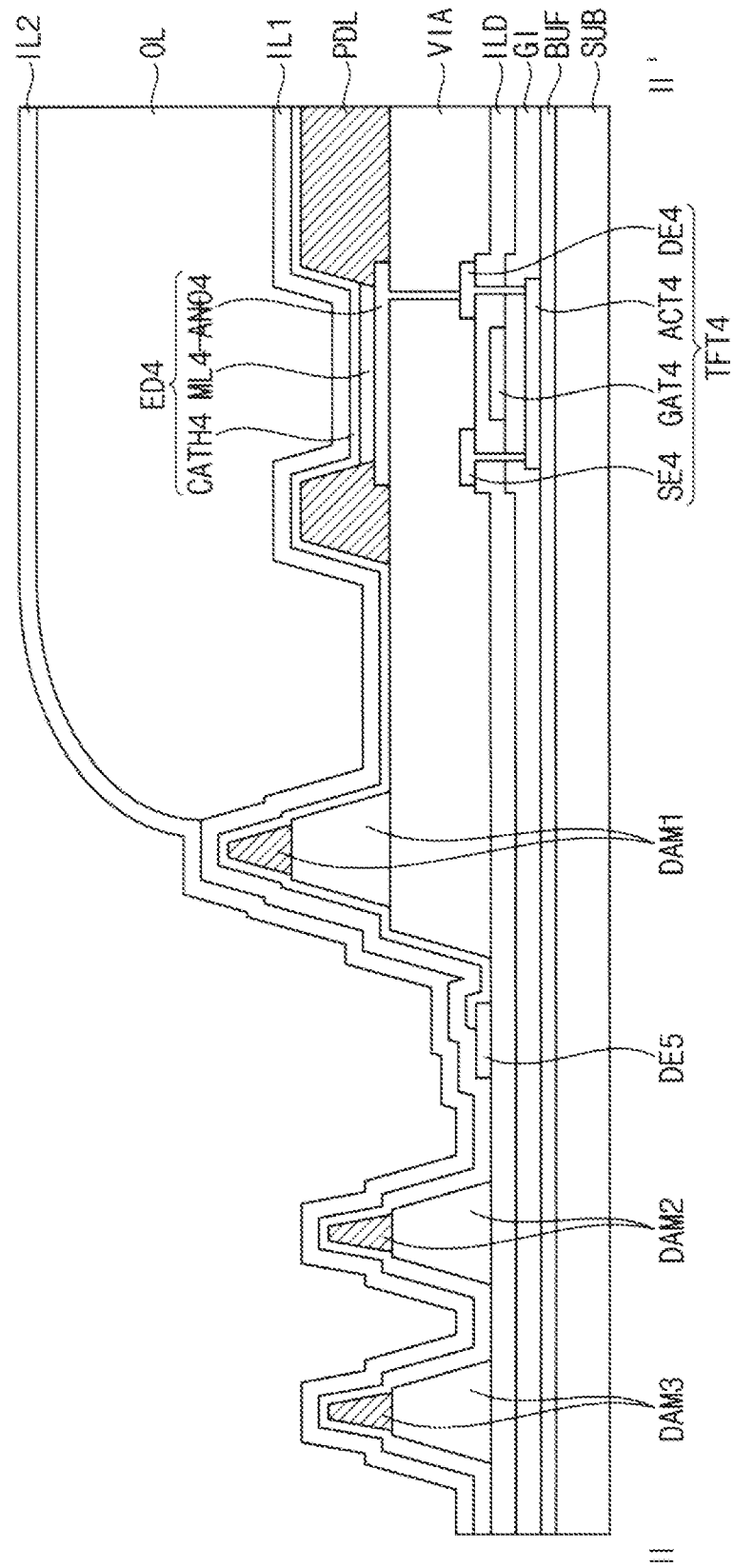

Referring to FIG. 10, in an embodiment, the first dam DAM1 may have a lower layer and an upper layer. In an embodiment, the lower layer may include substantially the same material as the via insulating layer VIA, and the upper layer may include substantially the same material as the pixel defining layer PDL. However, embodiments of the present disclosure are not limited thereto and in some embodiments, the first dam DAM1 may have three or more layers. As the height of the first dam DAM1 increases, the first dam DAM1 may further prevent the organic layer OL from overflowing outside of the display area DA to the non-display area.

Figure 11:
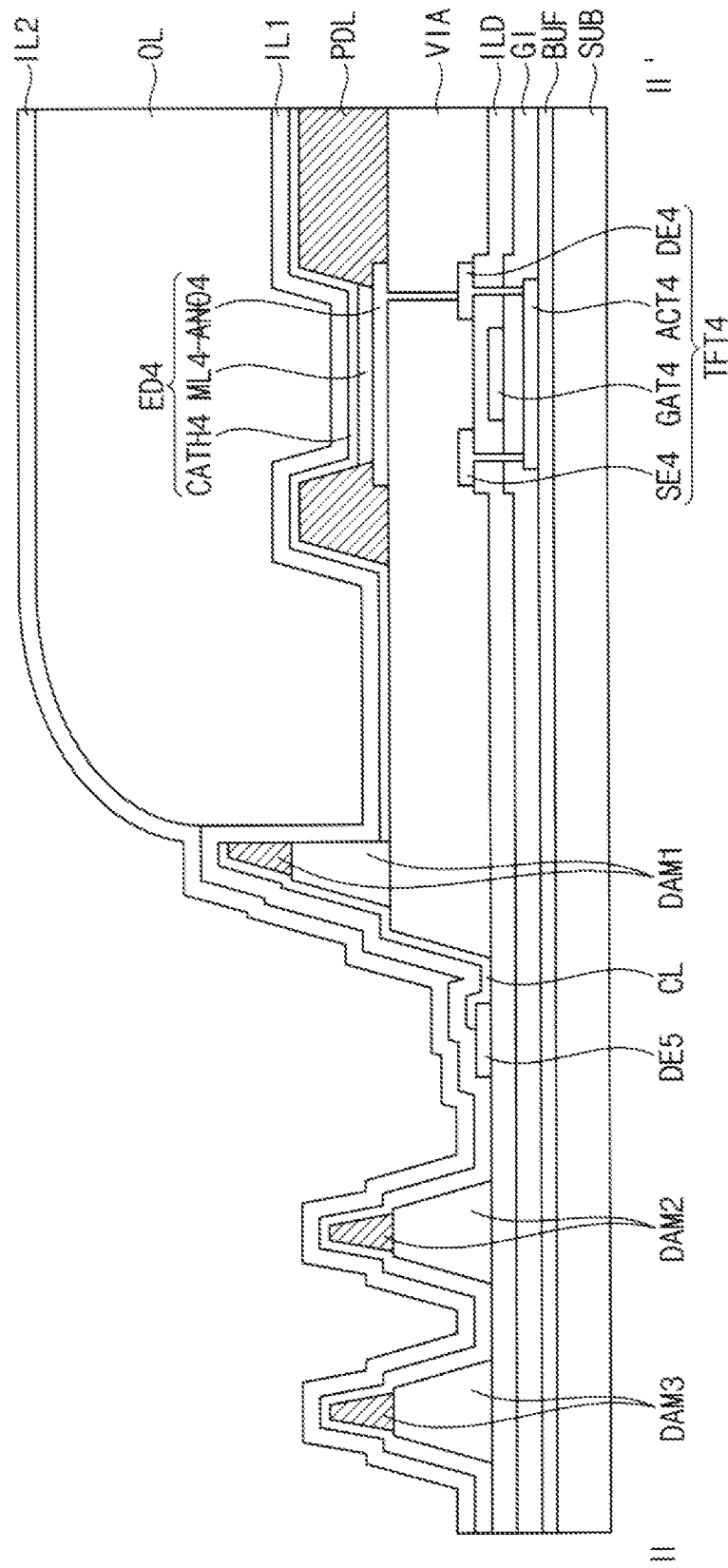

FIG. 11 may be substantially the same as FIG. 8, except that the first dam DAM1 is configured as a double layer. Accordingly, a repeated description of identical or similar elements will be omitted for convenience of explanation.

Figure 12:
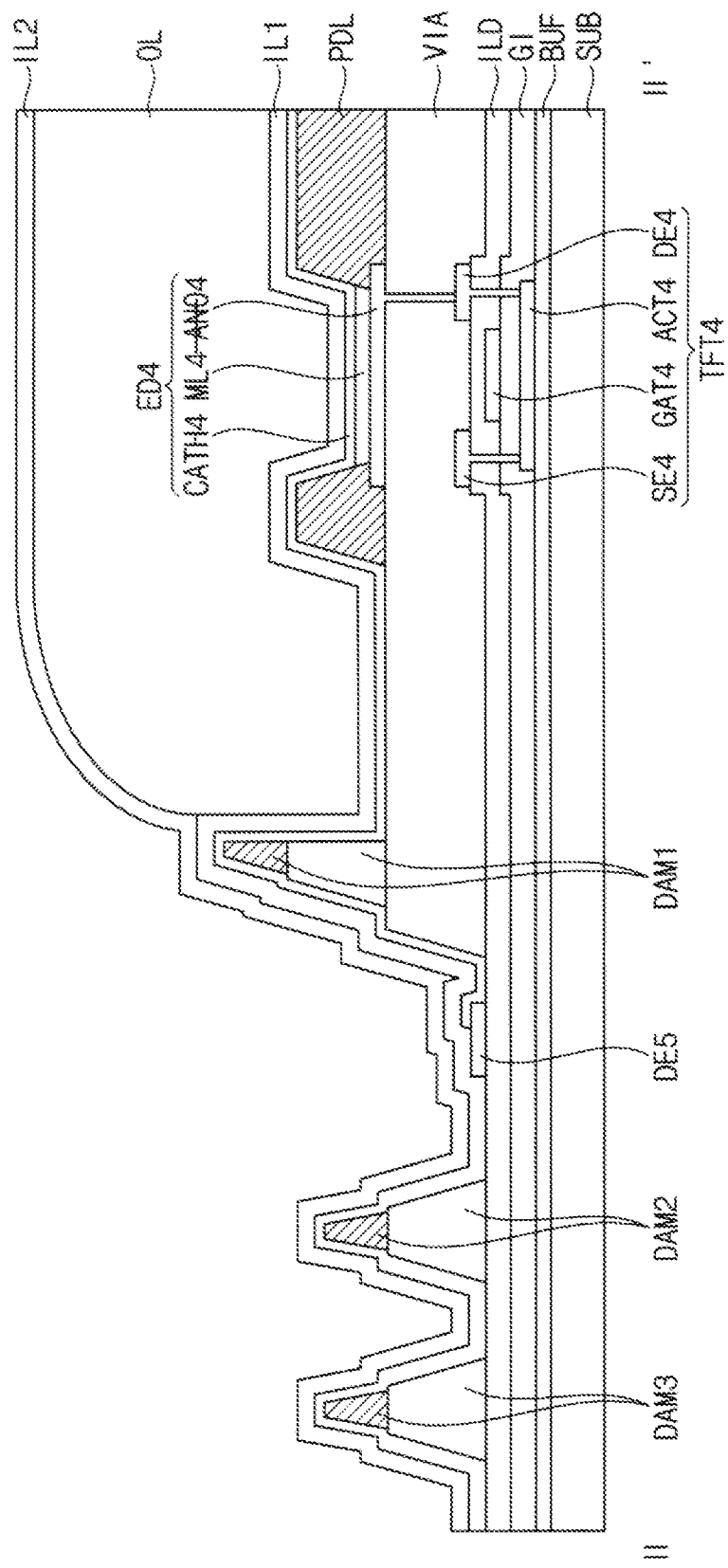

FIG. 12 may be substantially the same as FIG. 9, except that the first dam DAM1 is configured as a double layer. Accordingly, a repeated description of identical or similar elements will be omitted for convenience of explanation.

Figure 13:
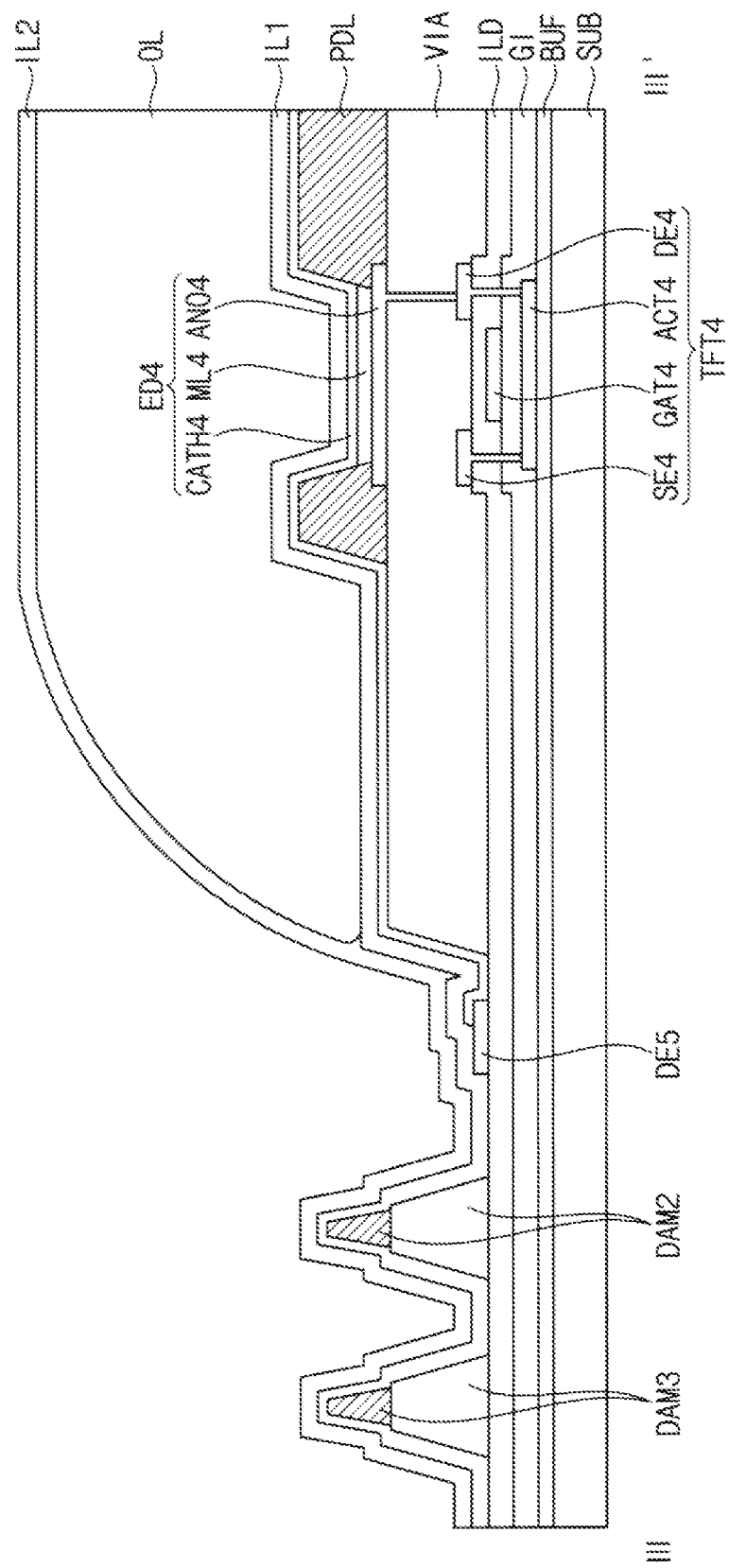
FIGS. 13 and 14 are cross-sectional views of a display device taken along line III-III' of FIG. 2 according to embodiments of the present disclosure.
Figure 14:
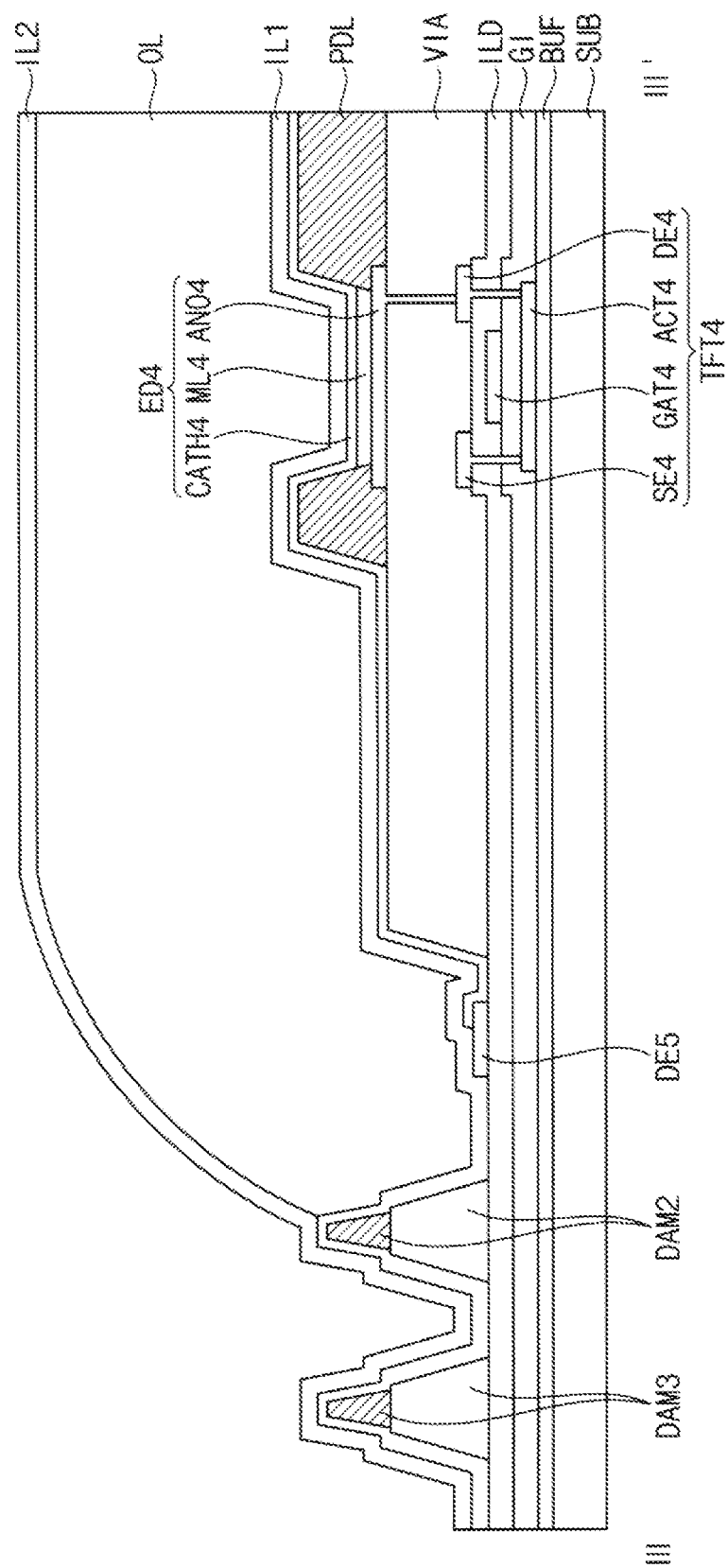

FIGS. 13 and 14 are cross-sectional views illustrating embodiments of the display device taken along line III-III' of FIG. 2. FIGS. 13 and 14 are cross-sectional views of embodiments of the display device in an area in which the first dam DAM1 is not disposed.

Referring to FIGS. 1, 2, 13 and 14, in an area of the display device where the first dam DAM1 is not present, the organic layer OL may extend to the non-display area NDA.

In an area of the display device where the first dam DAM1 is not present, such as an area between adjacent first dams of the plurality of first dams DAM1, the fourth cathode electrode CATH4 may not be disconnected. Therefore, even if the fourth cathode electrode CATH4 is disconnected in the area of the display device where the first dam DAM1 is disposed, a voltage transmitted from the fifth drain electrode DE5 may be transmitted to the fourth light emitting element ED4 through the fourth cathode electrode CATH4 disposed in the area of the display device where the first dam DAM1 is not disposed.

Figure 15:
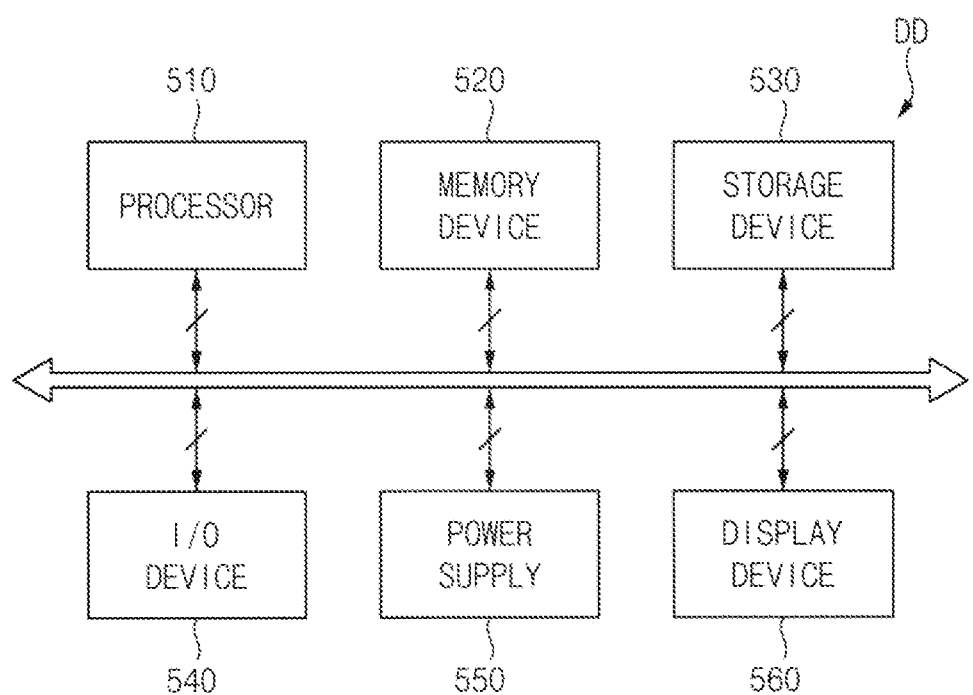
FIG. 15 is a diagram illustrating an electronic device according to an embodiment of the present disclosure.
Figure 16:
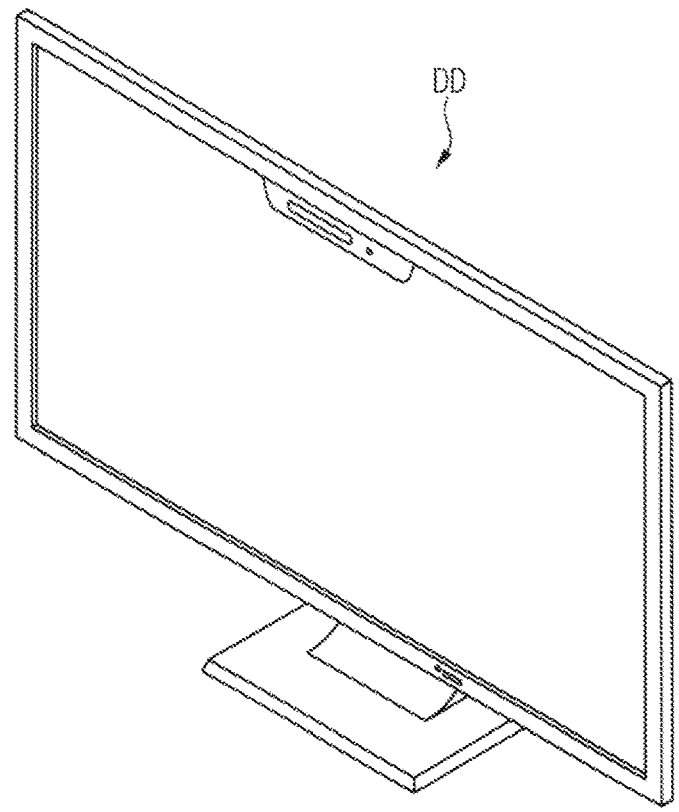
FIG. 16 is a perspective view in which the electronic device of FIG. 15 is implemented as a television according to an embodiment of the present disclosure.
Figure 17:
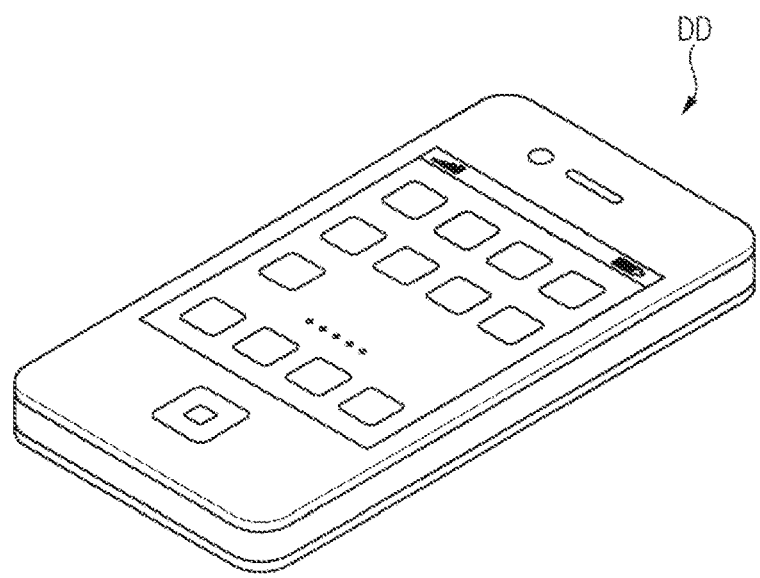
FIG. 17 is a perspective view in which the electronic device of FIG. 15 is implemented as a smartphone according to an embodiment of the present disclosure.

FIG. 15 is a diagram illustrating an electronic device according to an embodiment, FIG. 16 is a perspective view illustrating an embodiment in which the electronic device of FIG. 15 is implemented as a television, and FIG. 17 is a perspective view illustrating an embodiment in which the electronic device of FIG. 15 is implemented as a smartphone.

Referring to FIGS. 15, 16 and 17, an embodiment of an electronic device DD may include a processor 510, a memory device 520, a storage device 530, an input/output device 540 ("I/O Device"), a power supply 550, and a display device 560. In such an embodiment, the display device 560 may correspond to the display device described above with reference to the above drawings. In an embodiment, the electronic device DD may further include several ports capable of communicating with a video card, a sound card, a memory card, a USB device, and the like. In an embodiment, as illustrated in FIG. 16, the electronic device DD may be implemented as a television. However, embodiments of the present disclosure are not limited thereto. For example, in an embodiment, as illustrated in FIG. 17, the electronic device DD may be implemented as a smartphone. In an embodiment, the electronic device DD may be implemented as a mobile phone, a video phone, a smart pad, a smart watch, a tablet PC, a vehicle navigation system, a computer monitor, notebook computer, head mounted display ("HMD"), or the like.

The processor 510 may perform specific calculations or tasks. In an embodiment, the processor 510 may be a micro processor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PC") bus.

The memory device 520 may store data used for the operation of the electronic device DD. In an embodiment, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

The storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

The power supply 550 may supply power for the operation of the electronic device DD. In an embodiment, the display device 560 may be coupled to other components via buses or other communication links. According to an embodiment, the display device 560 may be included in the input/output device 540.

Embodiments of the display device may be applied to a display device included in a computer, a notebook, a mobile phone, a smartphone, a smart pad, a personal media player ("PMP"), a personal digital assistant ("PDA"), an MP3 player, or the like.

The present disclosure should not be construed as being limited to the embodiments set forth herein.

While the present disclosure has been particularly shown and described with reference to non-limiting embodiments thereof, it will be understood by those of ordinary skill in the art that various changes in form and details may be made therein without departing from the spirit or scope of the present disclosure.

What is claimed is:

1. A display device, comprising:
    a substrate including a display area and a non-display area surrounding the display area;
    a drain electrode disposed in the display area and positioned adjacent to the non-display area;
    a light emitting element disposed in the display area and connected to the drain electrode, the light emitting element is disposed farther from the non-display area than the drain electrode; and
    a plurality of first dams disposed in the display area and positioned between the drain electrode and the light emitting element, each of the plurality of first dams are spaced apart from each other.

2. The display device of claim 1, wherein, in a plan view, a shape of the plurality of first dams becomes narrower in a direction from the display area towards the non-display area.

3. The display device of claim 1, wherein, in a plan view, the plurality of first dams are arranged along an imaginary line extending in a first direction.

4. The display device of claim 1, wherein, in a plan view, the plurality of first dams are arranged in a zigzag form in relation to an imaginary line extending in a first direction.

5. The display device of claim 1, wherein, in a cross-sectional view, a sidewall of each of the plurality of first dams that is positioned in a direction towards the display area extends in a vertical direction that is perpendicular to the substrate.

6. The display device of claim 1, wherein, in a cross-sectional view, a height of each of the plurality of first dams gradually decreases in a direction from the display area towards the non-display area.

7. The display device of claim 1, further comprising a second dam disposed on the non-display area of the substrate.

8. The display device of claim 1, further comprising:
    a thin film encapsulation layer disposed on the light emitting element, and
    the thin film encapsulation layer includes:
        a first inorganic layer disposed on the light emitting element;
        an organic layer disposed on the first inorganic layer; and
        a second inorganic layer disposed on the organic layer.

9. The display device of claim 8, wherein:
    the plurality of first dams prevents the organic layer from overflowing from the display area to the non-display area; and
    the organic layer is also disposed in an area between adjacent first dams of the plurality of first dams.

10. The display device of claim 1, wherein a low power voltage is applied to the drain electrode.

11. A display device, comprising:
    a substrate including a display area and a non-display area surrounding the display area;
    a drain electrode disposed in the display area and positioned adjacent to the non-display area;
    a cathode electrode disposed in the display area and connected to the drain electrode, the cathode electrode is disposed farther from the non-display area than the drain electrode; and
    a plurality of first dams disposed in the display area and positioned between the drain electrode and the cathode electrode, each of the plurality of first dams are spaced apart from each other,
    wherein the cathode electrode is disposed to cover the plurality of first dams.

12. The display device of claim 11, wherein the cathode electrode is also disposed in an area between adjacent first dams of the plurality of first dams.

13. The display device of claim 11, wherein, in a plan view, a shape of the plurality of first dams becomes narrower in a direction from the display area towards the non-display area.

14. The display device of claim 11, wherein, in a cross-sectional view, a sidewall of each of the plurality of first dams that is positioned in a direction towards the display area extends in a vertical direction that is perpendicular to the substrate.

15. The display device of claim 14, wherein the cathode electrode is disconnected from the sidewall of each of the plurality of first dams that is positioned in the direction towards the display area.

16. The display device of claim 11, wherein, in a cross-sectional view, a height of each of the plurality of first dams gradually decreases in a direction from the display area towards the non-display area.

17. The display device of claim 11, further comprising a second dam disposed on the non-display area of the substrate.

18. The display device of claim 17, wherein:
    the second dam includes a plurality of second dams; and
    each of the plurality of second dams are spaced apart from each other.

19. The display device of claim 11, further comprising:
    a thin film encapsulation layer disposed on the cathode electrode, and
    the thin film encapsulation layer includes:
        a first inorganic layer disposed on the cathode electrode;
        an organic layer disposed on the first inorganic layer; and
        a second inorganic layer disposed on the organic layer.

20. The display device of claim 19, wherein:
    the plurality of first dams prevents the organic layer from overflowing from the display area to the non-display area; and
    the organic layer is also disposed in an area between adjacent first dams of the plurality of first dams.

* * * * *